United States Patent [19]
El-Kareh et al.

[11] Patent Number: 5,889,410
[45] Date of Patent: Mar. 30, 1999

[54] FLOATING GATE INTERLEVEL DEFECT MONITOR AND METHOD

[75] Inventors: Badih El-Kareh, Hopewell Junction; Stephen Parke, Poughkeepsie, both of N.Y.

[73] Assignee: International Business Machines Corporation, Armonk, N.Y.

[21] Appl. No.: 652,216

[22] Filed: May 22, 1996

[51] Int. Cl.⁶ .................................................. G01R 31/26
[52] U.S. Cl. ........................ 324/769; 324/763; 324/765; 438/17; 438/18; 257/48
[58] Field of Search .................................. 324/763, 765, 324/766, 769; 438/14, 17, 18; 257/48

[56] References Cited

U.S. PATENT DOCUMENTS

| | | | |
|---|---|---|---|
| 3,983,479 | 9/1976 | Lee et al. | 324/537 |
| 4,115,731 | 9/1978 | Axtell, III | 324/528 |
| 4,144,493 | 3/1979 | Lee et al. | 324/765 |
| 4,580,247 | 4/1986 | Adam | 365/200 |
| 4,595,875 | 6/1986 | Chan et al. | 324/522 |
| 4,801,869 | 1/1989 | Sprogis | 324/765 |
| 5,087,874 | 2/1992 | Robinson | 324/73.1 |
| 5,155,701 | 10/1992 | Komori et al. | 365/182 |
| 5,181,205 | 1/1993 | Kertis | 371/21.1 |
| 5,304,925 | 4/1994 | Ebina | 324/769 |
| 5,329,228 | 7/1994 | Comeau | 324/765 |
| 5,359,291 | 10/1994 | Dommerich, III | 324/523 |
| 5,394,101 | 2/1995 | Mitros | 324/769 |
| 5,400,344 | 3/1995 | Mori | 371/21.4 |

OTHER PUBLICATIONS

P. Puri, "Testing MOSFETs for Shorts", IBM Technical Disclosure Bulletin, vol. 15 No. 8, Jan. 1973, pp. 2469–2470.

H. Heimeier, et al., "Interlevel–Short Detector for Semiconductor Arrays", *IBM Technical Disclosure Bulletin*, vol. 28 No. 5, Oct. 1985, pp. 2008–2009.

A.P. Elias, "Functional Failure Analysis and Diagnostic Model", *IBM Technical Disclosure Bulletin*, vol. 27 No. 4A, Sep. 1984, pp. 1863–1865.

*Primary Examiner*—Glenn W. Brown
*Attorney, Agent, or Firm*—Schmeiser, Olsen & Watts

[57] ABSTRACT

According to the preferred embodiment, a defect monitor is provided that uses a floating gate structure. The defect monitor includes a common source, a common drain, and a plurality of floating gates interdispersed between the source and drain. Additionally, a conductor covers the plurality of floating gates. By applying a bias to the conductor and measuring the current flowing through the drain and source, the distribution of defects on the semiconductor wafer can be estimated.

16 Claims, 5 Drawing Sheets

FLOATING GATE INTERLEVEL DEFECT MONITOR AND METHOD

BACKGROUND OF THE INVENTION

1. Technical Field

This invention generally relates to semiconductor processing and more specifically relates to defect monitoring in semiconductor processing.

2. Background Art

An ongoing concern in semiconductor technology is the maximization of fabrication yield. One factor that leads to a reduction in fabrication yield is the presence of process-induced defects in the semiconductor device. Random defects are typically caused by foreign material (FM), particularly in the form of particles. The result of these defects are frequently circuit failure caused by unwanted shorts in conductive lines, between adjacent conductive lines, or between overlying conductive lines.

An analysis of the process-induced defects can be very useful in identifying and eliminating yield detractors. However, because of the complexity of modern Very Large Scale Integrated (VLSI) circuits, testing the actual semiconductor devices is very time consuming and costly. Additionally, the information gained from testing the actual devices is limited, as it is often impossible to determine the extent and frequency of the processing defects.

As a result of the above problems, it is preferable to fabricate special semiconductor-processing defect monitors that are dedicated to the analysis of processing defects. These defect monitors are built with structures comparable to those in the VLSI devices, but in such a way that the presence of defects in the defect monitors are more easily ascertained. These defect monitors are typically constructed at the same time but in a different location on the semiconductor substrate than the operation VLSI devices, and are discarded once the useful defect information is extracted from them.

These defect monitors can be used either by periodically fabricating a wafer with the defect monitor in the production line, or by including the defect monitor in otherwise unused portions of the semiconductor wafer. The latter approach has the advantage of having the defect monitor fabricated in the exact processing environment as the actual VLSI devices. Thus, the defects in the defect monitors more accurately reflect the defects that exist in the actual VLSI device.

For the same reason, it is desirable that the defect monitors use the same structure types and geometries found in the actual device, and are thus preferably manufactured using the same technologies as the actual device.

In the prior art, defect monitors that detect shorts between conductor levels (such as local conductor to polysilicon or first metal layer to local conductor in current DRAM and LOGIC technologies) are either limited to detecting the presence or absence of shorting defects or requiring sophisticated array circuits and time consuming analysis to locate defects and determine their size and distribution.

Therefore what is needed is a defect monitor that can more easily locate defect size and distribution, specifically, the size and distribution of interlevel defects.

DISCLOSURE OF INVENTION

According to the present invention, a defect monitor is provided that uses a floating gate structure. The defect monitor of the present invention overcomes and improves on the limitations of the prior art. The defect monitor includes a common source, a common drain, and a plurality of floating gates interdispersed between the source and drain. A conductor covers the plurality of floating gates.

By applying a bias to the conductor and measuring the current flowing through the drain and source, the distribution of defects on the semiconductor wafer can be determined.

It is thus an advantage of the present invention that the defect monitor is able to detect interlevel shorts and determine the shorting defect size and distribution by simple DC measurement and analysis.

The foregoing and other objects, features and advantages of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and.

BEST MODE FOR CARRYING OUT THE INVENTION

The preferred embodiment of the present invention provides a defect monitor that overcomes and improves on the limitations of the prior art. The defect-monitor of the preferred embodiment detects interlevel shorts and facilitates the determining of the shorting defect size and distribution by simple DC measurement and analysis.

The defect monitors of the preferred embodiment are designed to facilitate detection of the distribution of defects in VLSI semiconductor devices. Because of the complexity of the VLSI devices, they cannot be easily tested for defects. Instead the defect monitor is used to estimate the distribution of defects on the VLSI device.

The defect monitors of the preferred embodiment can be used either by periodically fabricating a wafer with the defect monitor in the production line, or by including the defect monitor in otherwise unused portions of the semiconductor wafer. In the preferred embodiment, the defect monitor has the same structure types and geometries, and is built with the same technologies as the actual semiconductor device. This being the case, the defects found on the defect monitor will accurately track and reflect those that are on the actual device. Thus, by measuring the distribution of defects on the defect monitor, the statistical distribution of defects on the VLSI devices of the wafer can be estimated.

Figure 1:
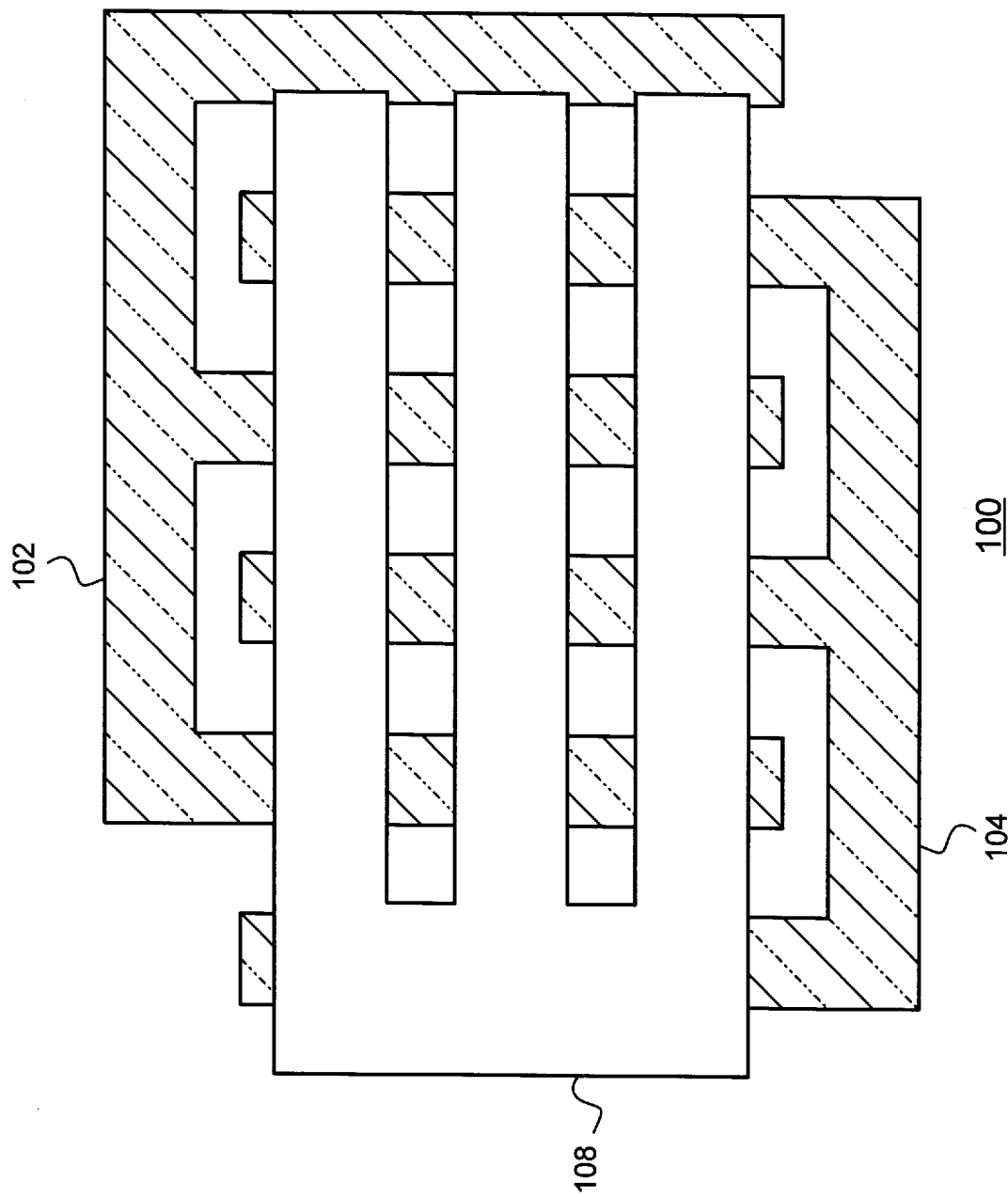
FIG. 1 is a top schematic view of a floating gate defect monitor 100.

FIG. 1 is a top schematic view of a floating gate defect monitor 100 in accordance with the preferred embodiment of the present invention. The defect monitor 100 includes a common source region 102 interdigitated with a common drain region 104. The source and drain regions 102 and 104 comprise appropriately doped regions of a semiconductor device. As previously stated, the geometries of the source and drain preferably will be similar to those found on the actual semiconductor device, resulting in an accurate modeling of defects on that device.

The areas between the source 102 and drain 104 serve as isolation, and as such are typically thick silicon dioxide. For example, the isolation can comprise oxide-filled shallow trench isolation (STI).

Atop the source and drain regions is a conductor 108. The conductor 108 is preferably deposited in the deposition process used to create conductor layers on the actual device. For illustration purposes, it will be assumed that conductor 108 is created as part of the local interconnect layer, or M0. Thus, the conductor 108 typically comprises a patterned metal such as tungsten. Of course, the structure of the present invention is not limited to a particular metal layer and can be used equally well for other layers, as will be later illustrated.

Figure 2:
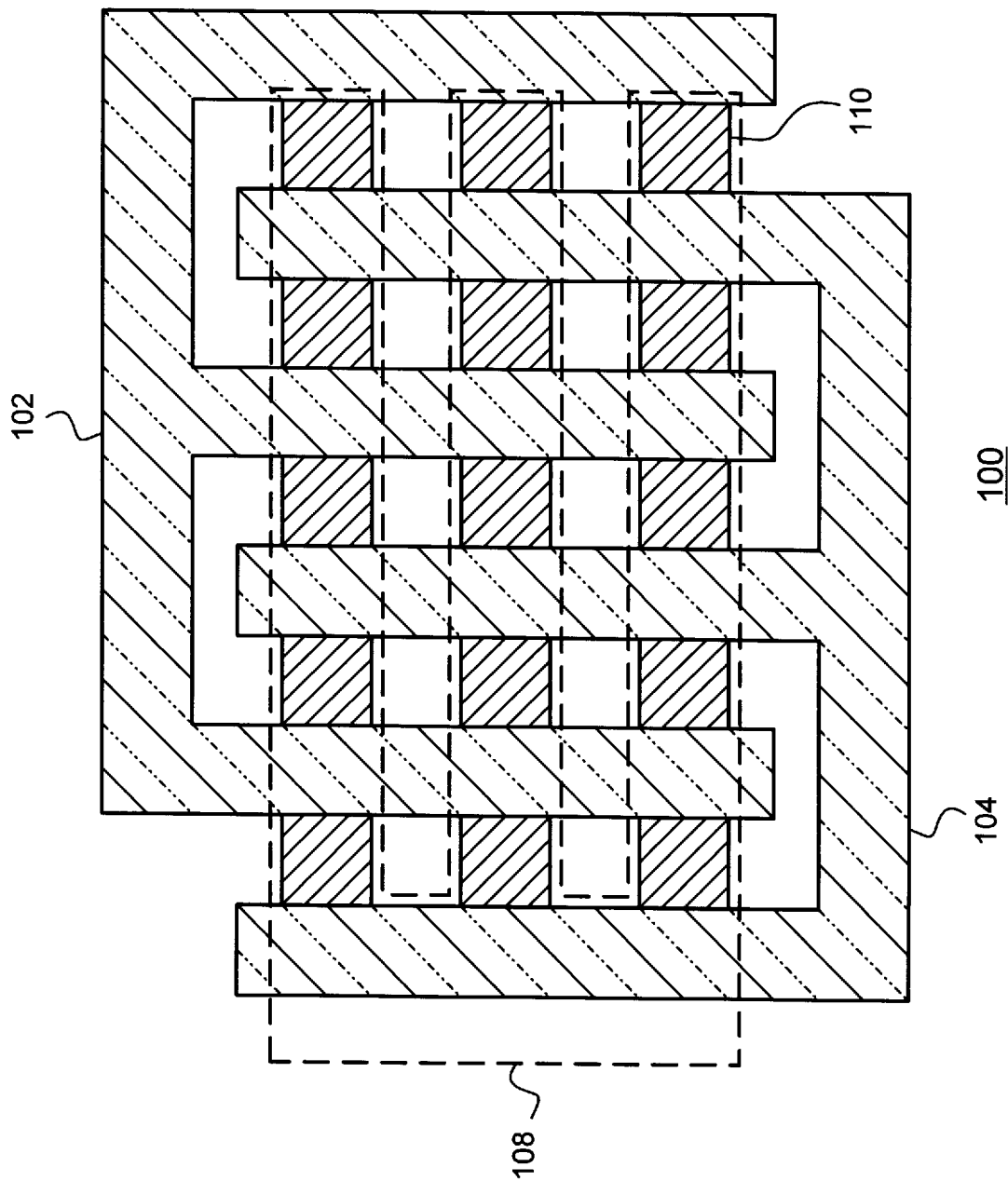
FIG. 2 is a top schematic view of a floating gate defect monitor 100 with conductor 108 shown in phantom.

FIG. 2 is a top schematic view of floating gate defect monitor 100 in accordance with the preferred embodiment. In the view of FIG. 2, conductor 108 is shown in phantom, such that the components under conductor 108 can be better illustrated. In particular, below conductor 108 and between source 102 and drain 104 are a plurality of floating gates 110. A floating gate is defined as a gate that has no direct electrical connection to it, and thus its relative bias "floats." Taken together, gates 110, source 102 and drain 104 make up a plurality of test field-effect transistors (FET) such as MOSFETS. Again, these devices are preferably made of the same technologies and geometries as field effect devices on the actual semiconductor devices. For example, the gates 110 can comprise polysilicon gates, as is known in the industry.

Figure 3:
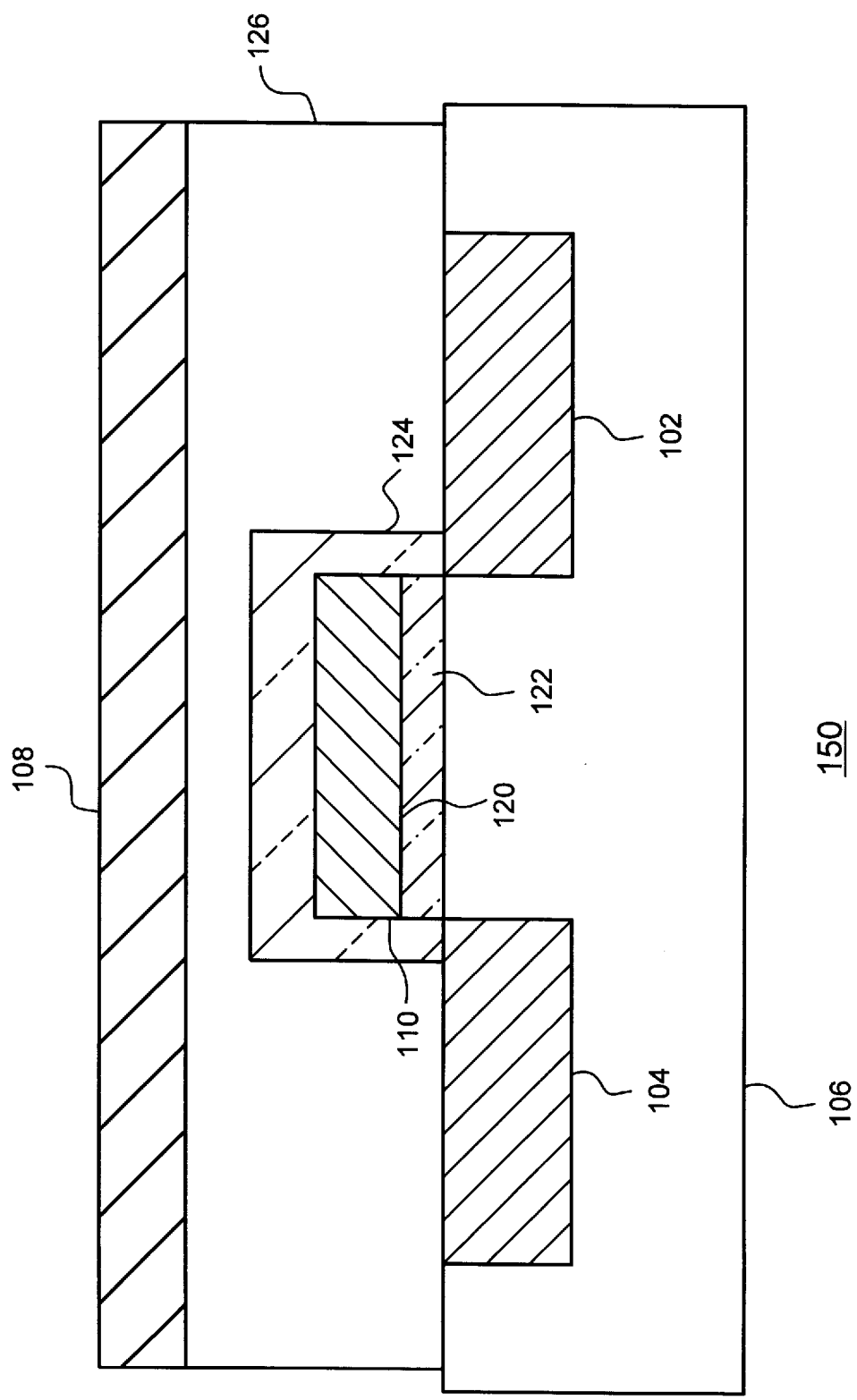
FIG. 3 is a cross sectional side view of a test field-effect transistor 150 in accordance with the preferred embodiment.

FIG. 3 is a cross sectional side view of a test FET 150 in accordance with the preferred embodiment. As previously stated, the defect monitor 100 includes a plurality of test FETs created from a common source and drain. Thus, the test FET 150 includes source 102, drain 104, one of the plurality of gates 110, and conductor 108. The source 102 and drain 104 are doped regions of the semiconductor substrate 106. Gates 110 are patterned over the active regions between common source 102 and common drain 104. In the illustrated embodiment, the gate 110 comprises a polysilicon gate conductor 120 above a thin gate dielectric 122. The gate dielectric 122 is typically a thin silicon dioxide film. Of course other dielectrics, such as oxidized nitrided oxides (ONO) or tantalum oxide, can be used. The gate is covered by an isolating layer 124, such as silicon nitride or silicon dioxide.

The defect monitor 100 comprises a plurality of test FETs 150 that each use a floating gate structure. With a floating gate structure there is no direct connection to the gate 110. In particular, the gate 110 is covered with an isolating layer 126, with no connection through to isolating layer 126 to the gate. The isolating layer 126 is typically a thick oxide.

By comparison, in a typical non-floating FET openings are patterned in isolation 126 to make contact between metal 108 and gate 110, source 102 and drain 104. In the test structure of the preferred embodiment, contacts are made only to source 102 and drain 104, so that gate 110 floats.

Above the isolating layer 126 and overlying the gate 110 is the conductor 108. Because of the isolator 126, conductor 108 is isolated from the gate 110 unless there is a defect that causes a short between the two. In the illustrated test FET 150, gate 110 is deposited as part of the polysilicon layer, and the conductor 108 is deposited as part of the local interconnect layer (M0).

The various layers for the test FETs of defect monitor 100 are designed to be fabricated by and correspond to layers fabricated in the actual semiconductor device. Thus, the defects in these various layers will track those in the actual device. The illustrated test FET 150 thus is configured to detect defects between M0 and polysilicon, as well as other types of defects.

Figure 4:
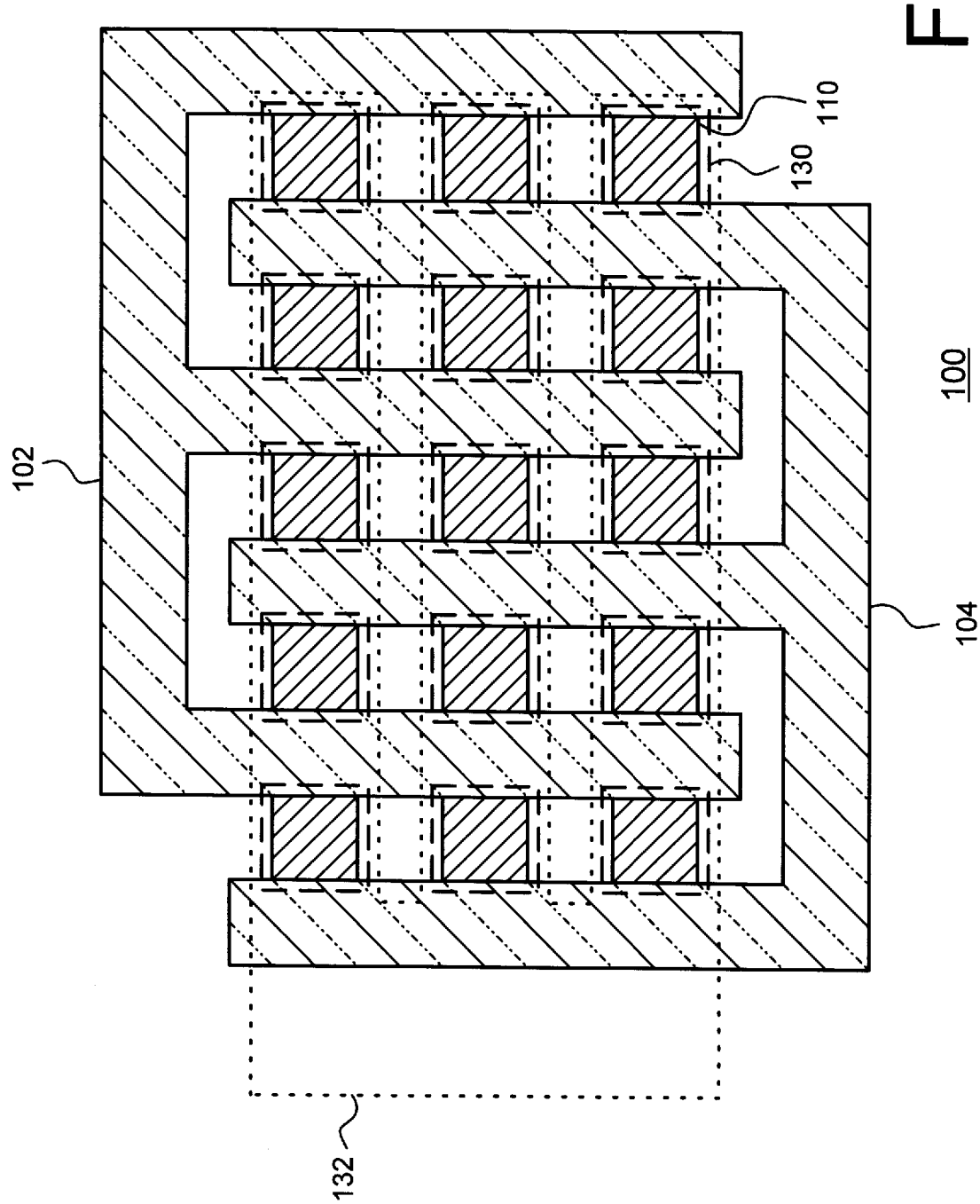
FIG. 4 is a schematic top view of an expanded floating gate defect monitor 100.

FIG. 4 is a schematic top view of defect monitor 100. The defect monitor 100 illustrated in FIG. 4 has been expanded through further process steps to detect defects between the local interconnect layer M0 and the first metal layer M1. In particular, conductor 108 has been patterned so that it now comprises a plurality of floating conductors 130, shown in phantom in FIG. 4, positioned over the gates 108.

Above the plurality of floating conductors 130, a second conductor 132, also shown in phantom in FIG. 4, is deposited. Preferably, second conductor 132 is created as part of the fabrication step that creates the next conductor level on the actual device. Thus, in the illustrated embodiment, the second conductor comprises a patterned M1 material, such as aluminum.

Figure 5:
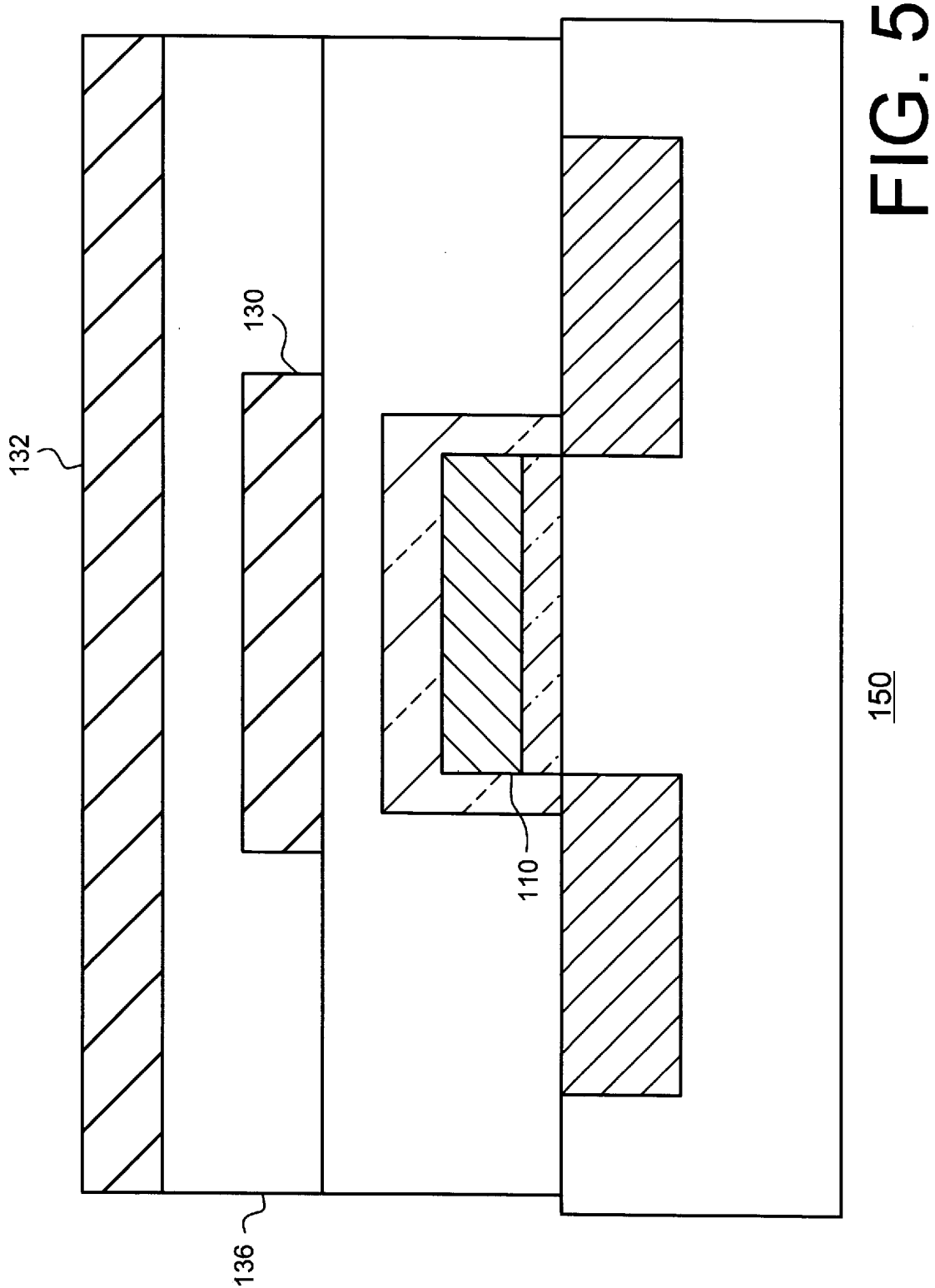
FIG. 5 is a cross sectional side view of a expanded test FET 150 in accordance with the preferred embodiment.

FIG. 5 is a cross sectional side view of an expanded test FET 150 in accordance with the preferred embodiment. Again, the test FET 150 is one of a plurality of test FETs on the defect monitor 100. To facilitate the detection of interlevel shorts, conductor 108 has been patterned, resulting in a plurality of floating conductors 130 over the plurality of gates 110. The floating conductors are preferably designed to be overlapping or fully inside gates 110. Over the floating conductors 130 is an isolation layer 136. The isolation layer 136 preferably comprises a dielectric such as thick silicon dioxide.

Above isolation layer 136 is a second conductor 132. Again, in the illustrated embodiment, the second conductor 132 is deposited as part of the first metal layer (M1). Because of isolation layer 136, the second conductor 132 will be insulated from floating conductors 130 unless there is an interlevel short caused by a process defect.

This floating gate test FET structure of the preferred embodiment can be expanded to facilitate the detection of shorts between other conductor layers, such as between M1 and M2, M2 and M3 and so forth, in addition to the structure shown in FIGS. 1–5 that facilitate short detection between the gates and M0, and M0 to M1.

For example, to facilitate the detection of shorts between M1 and M2, the second conductor 132 would be patterned and isolated, making another plurality of floating conductors on M1 directly above the plurality of floating conductors 130 on M0. Above these M1 floating conductors, a third conductor would be deposited, such as part of the second metal layer (M2). The M2 conductor and M1 floating conductors could then be used to detect shorts between M1 and M2. This process would be repeated again to detect shorts between M2 and M3. Thus, the structure of the preferred embodiment can be extended to detect interlevel shorts between all adjacent layers of the semiconductor device.

The gates and conductors are fabricated with the same technologies and geometries and with the same process steps used to create gates, local interconnects, and metal layers in the VLSI devices. As such, defects in the defect monitor 100, such as a short between floating conductor 130 and second conductor 132, will be present at rates that statistically track those same types of defects in the VLSI semiconductor devices. The defect monitor 100 can be used to determine statistical defect rates in the VLSI semiconductor devices.

The defect monitor 100 can be used to detect defects in different stages of manufacturing. For example, a defect monitor pulled after definition of local interconnects would be as illustrated in FIG. 2. This defect monitor could be used to detect shorts between polysilicon gates and local interconnects M0, among other tests. The defect monitor 100 could then be reintroduced into the fabrication line and pulled again after the deposition of the first metal layer M1. The defect monitor 100 would then be as illustrated in FIG. 4, and can be used defect shorts between M0 and M1, as well as shorts between polysilicon and M0.

In case there is concern about floating gates being charged-up during ion-implantation or other plasma, the defect monitor can be exposed to ultraviolet light to discharge the gates (as in EPROM) before it is used.

Using a defect monitor in accordance with the preferred embodiment, such as defect monitor 100, facilitates detection of interlevel shorts and the determination of shorting defect size and location by simple DC measurement and analysis. Specifically, the preferred embodiment allows for several standard testing procedures in addition to improved testing procedures.

The preferred defect monitor can be used for several standard semiconductor defect tests. For example, a standard forward/reverse test of source and drain to substrate can be done. This test detects contact continuity to source and drain as well as shorts between the source and drain to the substrate.

Also, a standard source to drain short test can be done. This test is typically done with no charge at the gate and detects shorts between the source and drain regions. Such shorts are typically caused by lateral "spiking," by an intervening gate to substrate short that gives rise to punch-through, or by a coincidence of gate to source and gate to drain shorts on the same FET.

Additionally, a standard test can be done for shorts between metal conducting layers, such as M0, and the source/drain regions.

If no failures are detected with these standard tests, or if simply more testing is desired, additional tests can be completed that takes advantage of the defect monitor's floating gate structure. The first of these tests includes a saturation-mode test for shorts between gate and drain. If there is a short between the drain and the gate, a bias applied to the drain will conduct to the gate. With such a bias applied to both the drain and gate, the test FET will be turned on in saturation mode. With the test FET in saturation mode, current will conduct between the source and drain according to known current-voltage characteristics. Thus, a bias is applied and the total current is measured and divided by the predicted single test FET current in the measured mode. Thus, with a simple DC measurement of the total current through the source and drain at a given drain voltage, the number of shorts between the drain and gate in the defect monitor can be calculated.

Additionally, the same procedure works to detect shorts between the source and gate by reversing the roles of source and drain. Again, if a short is present between the source and gate, a bias applied to the source will be conducted to the gate. This will put the test FET in saturation mode. By measuring the total current through the source and drain at a given source voltage, the number of shorts between the source and gate in the defect monitor can be calculated.

The number of short-causing defects detected on different-size defect monitors can be used for a statistical analysis of the size and distribution of source/gate and drain/gate defects likely to be on the actual VLSI devices. The second test to take advantage of the floating gate structure is an interlevel defect test which can be used to detect shorts between the gate and the conductor level above the floating gate. If there is a short between the conductor and the floating gate, the bias applied to the conductor will conduct to the gate. With the bias applied directly to the gate, the test FET will turn on at a nominal gate threshold voltage. Thus, the test FET will turn when a bias equal to the threshold gate voltage is applied if there is a short between the conductor and gate. The test involves applying a threshold voltage to the conductor and measuring the current flowing from the source to the drain. The total current measured divided by the predicted single test FET current gives the number of shorts between the gates and the conductor level above.

The single test FET current can be determined by calibrating the defect monitor. The calibration is done either by calculation, using the device vertical and horizontal geometries and well-known current-voltage relations, or by measurement of characteristics of contacted FETs of the same size (that are typically fabricated elsewhere on the same wafer).

Additionally, the test monitor can be calibrated by turning on all the FETs by capacitive coupling a bias to their gates, and measuring the total current. This is done by increasing the bias applied to the conductor. Because the gate and conductor are capacitively coupled through the isolator, as the bias on the conductor is increased, a bias appears at the gate. This capacitive coupled gate bias is a fraction of the bias applied to the conductor, with the fraction depending upon the ratio of capacitances. Thus, by increasing the bias on the conductor, the gate is indirectly biased as well to a known fraction of the conductor bias.

If the isolation layers are not too thick then as the conductor bias is increased, eventually the gate bias, being a fraction of the conductor bias, will reach the gate threshold voltage. Thus, all test FETs will be turned on by capacitive coupling. This allows the total current/voltage relationship for all devices to be measured. Thus, the defect monitor can be checked for proper operation. Also, this measurement serves as a check to assure the defect monitor is operating properly.

The interlevel short test can be used to detect shorts in between other conductor layers, such as between M0 and M1, M1 and M2, in addition to the test for shorts between M0 and the polysilicon gates illustrated above. To complete these tests, floating conductors are used that are capacitively coupled to the floating gates. For example, in the defect monitor 100 illustrated in FIGS. 4, with a plurality of test FETs as illustrated in FIG. 5, the first conductor layer 108 is patterned and isolated over the gate to make a plurality of floating conductors 130. These floating conductors are part of the M0. A second conductor 132 is deposited and patterned above floating conductors 130. The second conductor 132 is part of the first metal layer M1. Thus, the floating conductors 130 and second conductor 132 can be used to detect the frequency of shorts between M0 and M1 layers.

For this purpose, a bias is applied to the second conductor. Because the floating conductors and floating gates are each floating, a capacitive coupling will exist between them and the second conductor. The capacitive coupling will cause a bias to appear on the floating conductors, the bias being a fraction of that on the second conductor. Likewise, the capacitive coupling will cause a bias to appear on the floating gates, with this bias being a fraction of that on the floating conductors.

Thus, if a sufficiently strong bias is applied to the second conductor, through capacitive coupling, all the test FETs can be turned on. The total current can then be measured. Again, this can be used to check for proper defect monitor operation.

If a short exists between M1 and M0, a bias applied at the second conductor will appear at the floating conductor. This bias will then be capacitively coupled to the floating gates. Thus, because of the short, a lower bias will be required to turn on the test FET. By measuring the total current at this lower voltage, the number of shorts between M1 and M0 can be determined.

This test allows determining the type and number of shorts. For example, the voltage required to turn on the FET in the absence of a short can be predicted from capacitive coupling calculations. If such as voltage must be applied to the conductor to induce current in the FET, it is concluded that there are no interlevel shorts in the structure. If, however, the FET can be turned on at a smaller bias, it may be concluded that there is one or more shorts between the floating conductor and the floating gate, or between the two conductor levels, depending upon the magnitude of the applied. A short between the local interconnect (M0) and the first metal (M1), for example, will cause the FET to turn on at a different bias than a short between M0 and the gate conductor. A coincidence of two shorts (gate to M0 and M0 to M1) can also be detected. In this case, the FET turns on at the nominal threshold voltage.

Thus, by measuring the current at different conductor bias levels, the distribution of shorts between gate and interconnect, interconnect and first metal layer, and so forth, can be determined.

These processes can be expanded for other layers. For example, the second conductor layer can be patterned and isolated to form a second plurality of floating conductors. With a deposited and patterned second metal layer (M2) atop the second plurality of floating conductors, the defect monitor can be used to detect the frequency of shorts between M2 and M1. This structure can be extended for all layers of the semiconductor device.

While the invention has been particularly shown and described with reference to a preferred exemplary embodiment thereof, it will be understood by those skilled in the art that various changes in form and details may be made therein without departing from the spirit and scope of the invention. For example, the geometries and configurations of the defect monitors can be used to improve the size and spatial resolution of the defect detection.

We claim:

1. A method for estimating the distribution of defects in a semiconductor device fabricated on a semiconductor wafer, the method comprising the steps of:
   a) fabricating a defect monitor on said wafer, the defect monitor including:
      1) a common source;
      2) a common drain;
      3) a plurality of floating gates, said plurality of floating gates interdispersed between said common source and said common drain;
      4) a conductor, said conductor overlying at least one of said plurality of floating gates;
   b) applying a bias to said conductor; and
   c) measuring the current flowing through said common drain and said common source.

2. The method of claim 1 further comprising the steps of:
   applying bias to said common source and measuring current flowing through said common source and common drain while said bias to said common source is applied; and
   applying a bias to said common drain and measuring current flowing through said common source and common drain while said bias to said common drain is applied.

3. The method of claim 1 wherein said step of applying a bias to said conductor includes the step of applying a bias such that current will flow between said source and said drain if a short exists between at least one of said plurality of floating gates and said conductor.

4. The method of claim 1 wherein said step of applying a bias to said conductor includes the steps of:
   applying a bias such that current will flow between said source and said drain if a short exists between at least one of said plurality of floating gates and said conductor; and
   applying a bias such that a bias will appear on the plurality of floating gates through capacitive coupling such that a current will flow between source and drain at all of said gates.

5. The method of claim 1 further comprising testing said defect monitor by:
   applying a bias to said conductor sufficient to bias the plurality of floating gates through capacitive coupling such that a test current will flow between source and drain at all of said gates; and
   measuring said test current.

6. The method of claim 1 further comprising the steps of:
   d) removing a portion of said conductor and isolating remaining portions of said conductor, such that remaining portions comprise a first plurality of floating conductors, each of said first plurality of floating conductors covering at least a portion of one of said plurality of floating gates;
   e) applying a second conductor, said second conductor overlying said first plurality of floating conductors and being capacitively coupled to said first plurality of floating conductors;
   f) applying a bias to said second conductor; and
   g) measuring the current flowing through said common drain and common source.

7. The method of claim 6 further comprising the steps of:
   h) removing a portion of said second conductor and isolating remaining portions of said second conductor, such that remaining portions comprise a second plurality of floating conductors, each of said second plurality of floating conductors covering at least a portion of one of said first plurality of floating conductors;
   i) applying a third conductor, said third conductor overlying said second plurality of floating conductors and being capacitively coupled to said second plurality of floating conductors;
   j) applying a bias to said third conductor; and
   k) measuring the current flowing through said common drain and common source.

8. A method for estimating the distribution of defects in a semiconductor device fabricated on a semiconductor wafer, the method comprising the steps of:
   a) fabricating a defect monitor on said wafer, the defect monitor including:
      1) a common source;
      2) a common drain, said common drain interdigitated between said common source;
      3) a plurality of floating gates, said plurality of floating gates interdispersed with said common source and said common drain;

4) a conductor, said conductor covering said plurality of floating gates;

b) applying a bias to said conductor;

c) measuring the current flowing through said common drain and said common source;

d) removing a portion of said conductor and isolating remaining portions of said conductor, such that remaining portions comprise a plurality of floating conductors, each of said plurality of floating conductors covering at least a portion of one of said plurality of floating gates;

e) applying a second conductor, said conductor covering said plurality of floating conductors;

f) applying a bias to said second conductor; and g) measuring the current flowing through said common drain and common source.

9. A defect monitor for use in estimating the distribution of defects in an integrated semiconductor device wafer, wherein the defect monitor is fabricated on a portion of the semiconductor wafer, the defect monitor comprising:

a) a common source;

b) a common drain;

c) a plurality of floating gates, said plurality of floating gates interdispersed between said common source and said common drain;

d) a common conductor, said common conductor overlying said plurality of floating gates.

10. The defect monitor of claim 9 wherein said common conductor is capacitively coupled to said plurality of floating gates.

11. The defect monitor of claim 9 wherein said plurality of floating gates are polysilicon gates and wherein said common conductor comprises a metal conductor deposited as part of the local interconnect layer.

12. The defect monitor of claim 9 wherein a second conductor is formed between said common conductor and said plurality of floating gates and wherein said second conductor is further patterned and isolated, such that said second conductor comprises a first plurality of floating conductors, each of said floating conductors overlying one of said floating gates and wherein said common conductor overlies said first plurality of floating conductors.

13. The defect monitor of claim 12 wherein said common conductor comprises a metal conductor deposited as part of a first metal layer.

14. The defect monitor of claim 12 wherein a third conductor is formed between said second conductor and said common conductor and wherein said third conductor is further patterned and isolated, such that said third conductor comprises a second plurality of floating conductors, each of said second plurality of floating conductors overlies one of said first plurality of floating conductors, and wherein said common conductor overlies said second plurality of floating conductors.

15. The defect monitor of claim 14 wherein said common conductor comprises metal deposited as part of a second metal layer.

16. A defect monitor for use in estimating the distribution of defects in an integrated semiconductor device fabricated on a semiconductor wafer and wherein the defect monitor is fabricated on a portion of said semiconductor wafer, the defect monitor comprising:

a) a common source;

b) a common drain, said common drain interdigitated between said common source;

c) a plurality of polysilicon floating gates, said plurality of floating gates interdispersed with said common source and said common drain;

d) a common conductor, said common conductor covering said plurality of floating gates, said conductor comprises metal deposited as part of the first metal layer.

* * * * *